(12) United States Patent
Hashimoto et al.

(10) Patent No.: US 6,902,433 B1
(45) Date of Patent: Jun. 7, 2005

(54) CONNECTOR RECEPTACLE

(75) Inventors: Takeshi Hashimoto, Osaka (JP);
Yoshiaki Kanbe, Osaka (JP); Takayasu Ito, Osaka (JP); Syunsuke Matsushima, Osaka (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 10/362,122

(22) PCT Filed: Aug. 22, 2000

(86) PCT No.: PCT/JP00/05619

§ 371 (c)(1),
(2), (4) Date: Feb. 21, 2003

(87) PCT Pub. No.: WO02/17053

PCT Pub. Date: Feb. 28, 2002

(51) Int. Cl.[7] ............................................... H01R 13/66
(52) U.S. Cl. ...................................................... 439/620
(58) Field of Search ............................. 439/620, 76.1, 439/493, 76, 77, 608, 67

(56) References Cited

U.S. PATENT DOCUMENTS 6,139,357 A * 10/2000 Shih ............................ 439/493

6,168,469 B1 * 1/2001 Lu .............................. 439/608
6,585,540 B2 * 7/2003 Gutierrez et al. ........... 439/620

FOREIGN PATENT DOCUMENTS

| JP | 2-117077 | 5/1990 |
| JP | 6-19516 | 1/1994 |
| JP | 6-151011 | 5/1994 |
| JP | 7-85929 | 3/1995 |

* cited by examiner

*Primary Examiner*—J. F. Duverne
(74) *Attorney, Agent, or Firm*—Oblon, Spivak, McClelland, Maier & Neustadt, P.C.

(57) ABSTRACT

A connector receptacle (20) is constituted by a contact (2) to which a data signal is serially communicated through a connector plug and a physical layer basic circuit (5) provided inside the connector receptacle (20) and adapted to perform specified processings so that the data signal is parallel communicated between the basic circuit and a link layer circuit for the communication. As a result, the distance between the contact (2) and the physical layer basic circuit (5) is short. Therefore, it is not necessary to pay so much attention as in conventional cases in designing a pattern layout (7) so as to prevent influence on the EMI and transmission characteristics, and it is easy to design the layout of the pattern constituting the transmission line for the data.

10 Claims, 11 Drawing Sheets

CONNECTOR RECEPTACLE

TECHNICAL FIELD

The present invention relates to a connector receptacle used for high-speed transmission of a digital signal.

BACKGROUND ART

Figure 21:
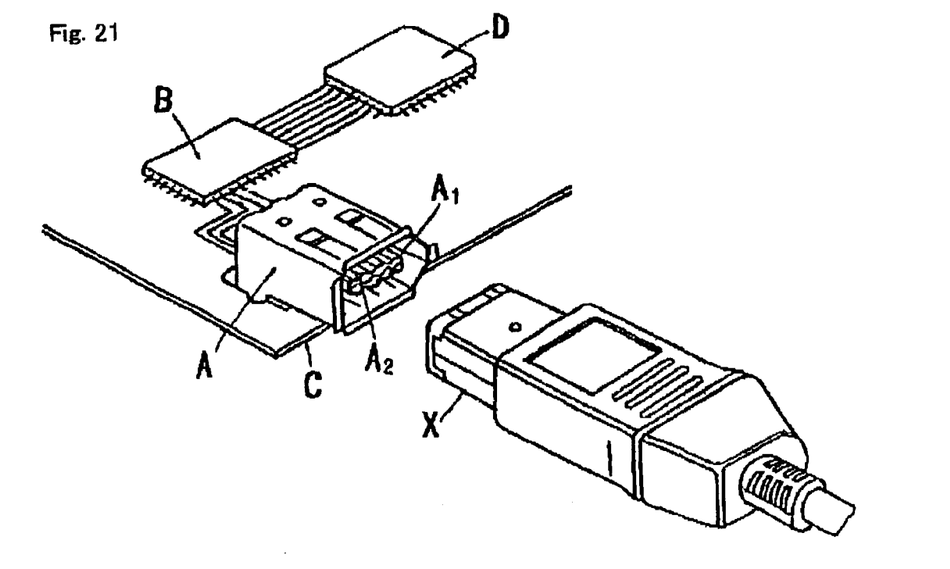
FIG. 21 is a perspective view showing a conventional example.

Conventionally, a connector apparatus shown in FIG. 21 is used for high-speed transmission of a digital signal. The apparatus comprises a connector receptacle A, a physical layer basic circuit B and a printed circuit board C.

The connector receptacle A comprises a mating portion $A_1$ to which a connector plug X is mated with and a plurality of contacts $A_2$ individually connected to connecting portions of the connector plug X fit in the mating portion $A_1$.

The physical layer basic circuit B is formed of a LSI and the physical layer basic circuit B performs predetermined operations such as serial-parallel conversion, encoding and decoding operations and connector input-output control so that a data signal is communicated in series from the connector plug X to the contacts $A_2$ and the data signal is communicated in parallel with a link layer circuit D for communication.

On the printed circuit board C, the LSI constituting the physical layer basic circuit B is mounted and transmission lines through which the data signal is transmitted from the connector plug X to the link layer circuit D are patterned.

According to the above-described conventional technology, that is, the technology in which the LSI constituting the physical layer basic circuit B is mounted onto the printed circuit board C, the transmission lines patterned on the printed circuit board C exerts large influence on EMI or transmission characteristics depending on its patterned layout when the digital data signal is transmitted at high speed. Therefore, it is necessary to pay enough attention to design the layout of the patterns so as to prevent the influence on the EMI or the transmission characteristic, which arises a problem in that it is difficult to design the layout of the patterns of the transmission lines for the data signal.

The present invention was made in view of the above problem and it is an object of the present invention to provide a connector receptacle in which it is easy to design a layout of patterns constituting transmission lines for the data signal.

DISCLOSURE OF THE INVENTION

A connector receptacle according to the present invention comprises a mating portion to which a connector plug is mated with, a plurality of contacts individually connected to the connector plug mate with the mating portion, and a physical layer basic circuit performing predetermined operations so that a data signal is communicated in series with the contacts through the connector plug and the data signal is communicated in parallel with a link layer circuit.

Thus, since the physical layer basic circuit is provided at the connector receptacle itself, the distance between the contacts and the physical layer basic circuit is shorter than the conventional example in which the physical layer basic circuit is mounted on the printed circuit board. Therefore, it is not necessary to pay so much attention as in the conventional example in designing a pattern layout so as to prevent an influence on an EMI or transmission characteristic, and it becomes easy to design the layout of the patterns constituting transmission lines for the data signal.

In addition, the following configurations are desirable, that is, the configuration in which the data signal is communicated in series from the contacts to the physical layer basic circuit through the transmission lines each having almost constant characteristic impedance, or the configuration in which the data signal is transmitted from each of the plurality of contacts to the physical layer basic circuit through the transmission lines each having almost the same length. In such configurations, a reflection of the data signal at the time of input-output can be reduced and skew between the data signals can be also reduced.

Furthermore, it is desirable that the data signal is transmitted in parallel through transmission lines which are N times as many compared with those of the serial communication, and a rise time and fall time when the data signal is communicated in parallel is N times as long compared with that when it is communicated in series. Thus, a high frequency ingredient is alleviated and the EMI can be reduced.

In addition, when there is provided a shielding member for shielding the transmission lines from the outside to which the data signal is transmitted from the connector plug, the EMI is further reduced.

Furthermore, when the physical layer basic circuit is provided on the substrate and the contacts are positioned so as to be at almost the same plane as the substrate, bending portions of the transmission lines can be reduced, whereby the transmission characteristic can be improved.

Meanwhile, it is possible to provide a plurality of the mating portions. At this time, if the physical layer basic circuit performs predetermined operations so that the data signal is transmitted in series with the connector plugs mate with the plurality of the fitting portions and it is communicated in parallel with the link layer circuit, there is only one physical layer basic circuit and thus, the whole size can be miniaturized.

Furthermore, it is possible that the physical layer basic circuit is provided on an MID substrate and the contacts are held on the MID substrate. Thus, since it is not necessary to additionally provide a member for holding the contacts, the number of parts can be reduced.

BEST MODE FOR CARRYING OUT THE INVENTION

Embodiment 1

Figure 1:
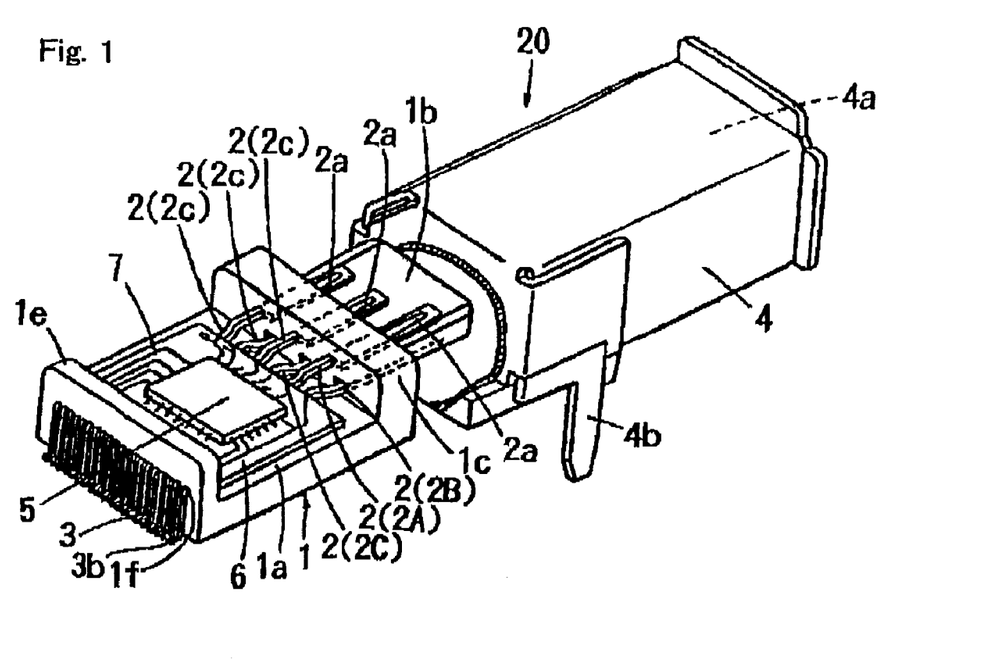
FIG. 1 is a perspective view showing a connector receptacle according to an embodiment 1 of the present invention.

A connector receptacle according to an embodiment 1 of the present invention will be described in reference to FIGS. 1 to 8. As shown in FIG. 1, the connector receptacle 20 comprises a housing 1, contacts 2, terminals 3, a shell 4, a physical layer basic circuit 5 and a substrate 6. A digital signal is communicated at high speed through the connector receptacle 20.

The housing 1 is formed of an insulating material and there is provided a substrate bonded portion 1a on which the substrate 6 is bonded by digging its central portion such that its both ends are left. In addition, in the housing 1, a contact supporting portion (Insertion Wafer) 1b to which a connector plug X (not shown) is mated with is extended from its one end.

Figure 5:
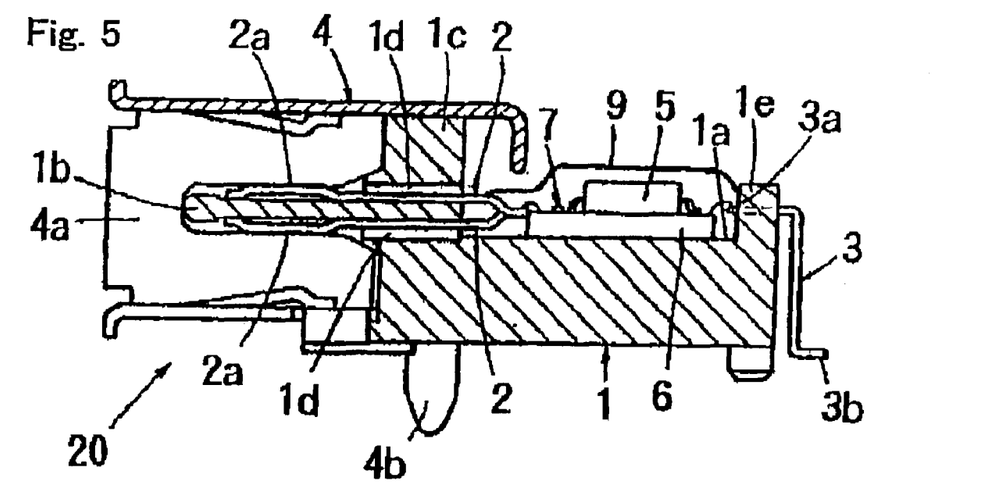
FIG. 5 is a side sectional view showing the connector receptacle.

The contact 2 is connected from one end portion to a central portion of a connecting portion (not shown) of the connector plug X mate with the contact supporting portion 1b. As shown in FIG. 5, contact touching portions 2a of the contacts 2 which are directly in contact with the connector plug X are manufactured so as to be rounded.

Figure 2:
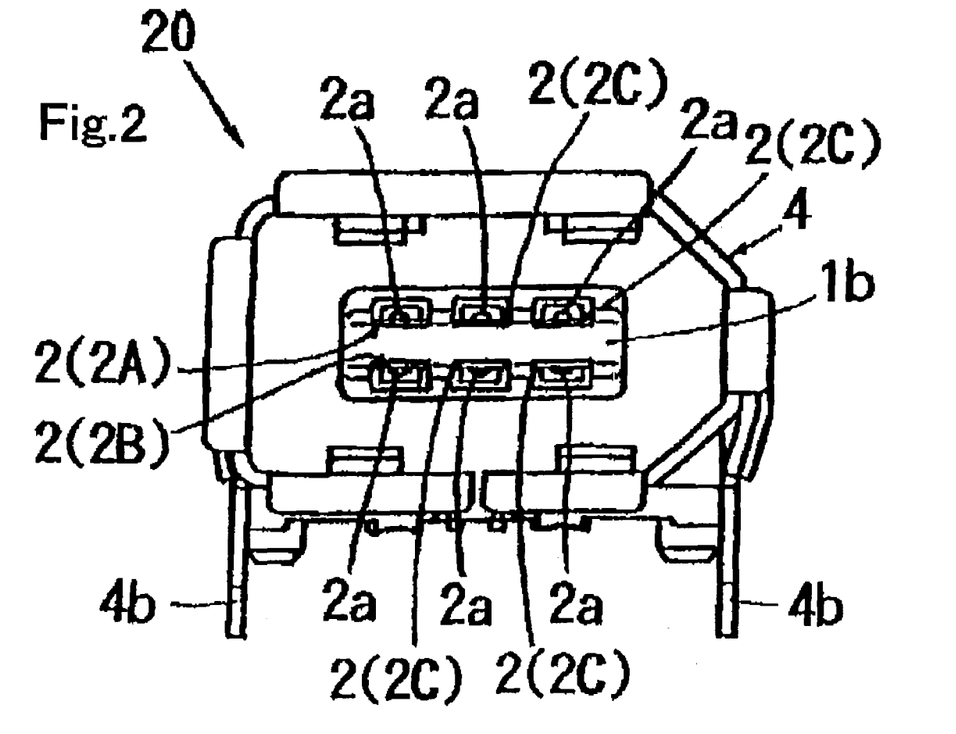
FIG. 2 is a front view showing the connector receptacle.

As shown in FIG. 2, the contacts 2 are arranged at upper and lower portions on both sides of the contact supporting portion 1b in its thickness direction and three contacts of each of the upper and lower portions are arranged at intervals of a predetermined distance in its width direction and protrude from the one end of the housing 1 in a state of being pressed and held in contact press-fitting holes 1d provided in the contact holding portion 1c which consists of the one end of the housing 1.

More specifically, as shown in FIG. 1, six contacts 2 protrude in total, in which one of two long contacts is a contact 2B for a power supply, the other is a contact 2A for ground and the remaining four contacts are contacts 2C for digital signals.

Figure 3:
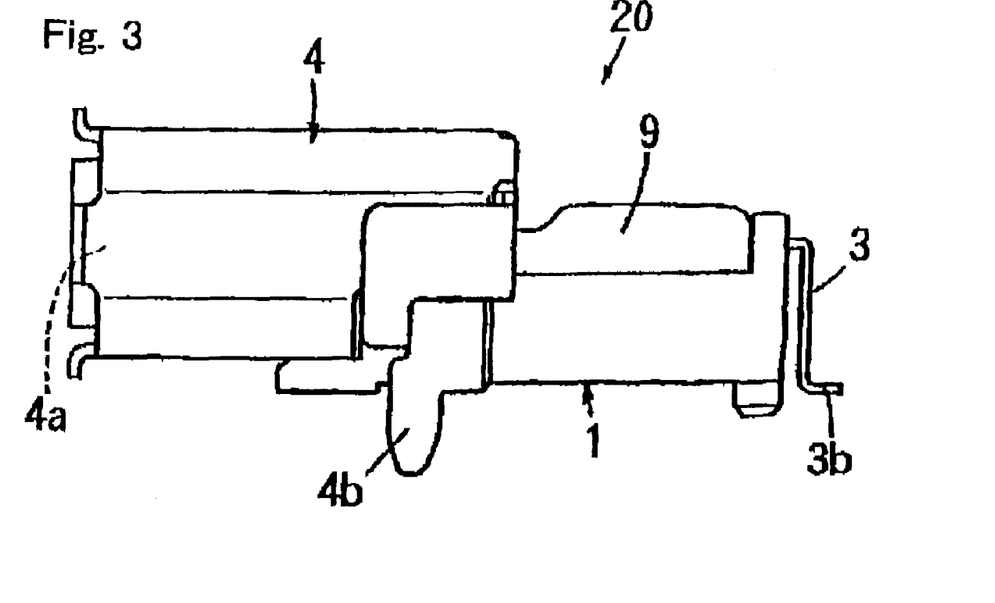
FIG. 3 is a side view showing the connector receptacle.
Figure 4:
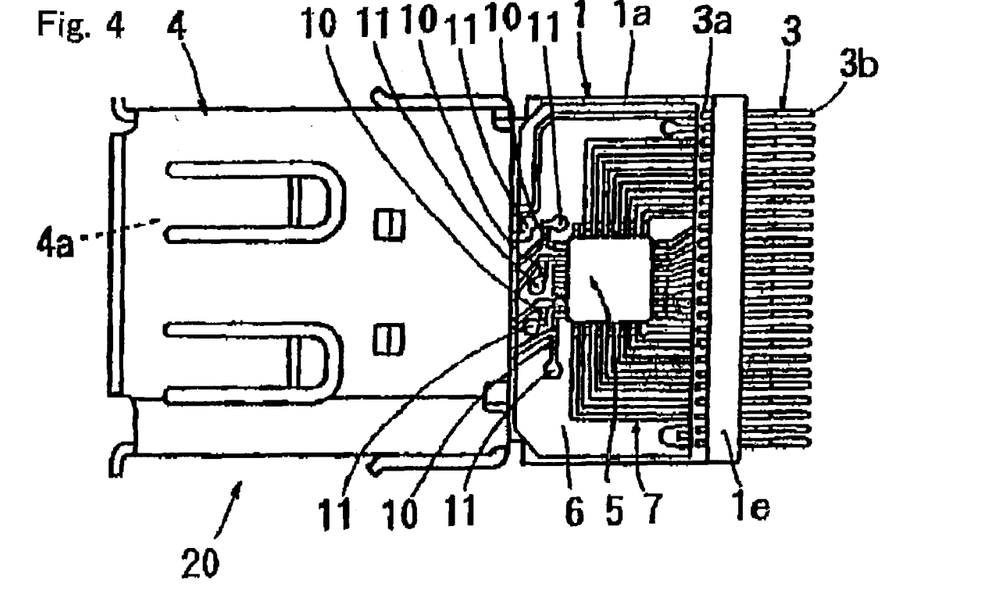
FIG. 4 is a plane view showing the connector receptacle.

The terminals 3 are pressed and held in a terminal press-fitting hole 1f provided in a terminal holding portion 1e consisting of the other end of the housing 1. As shown in FIG. 4, substrate connecting portions 3a comprising one end portion of the terminals 3 protruding to the side of the substrate bonded portion 1a of the housing 1 are electrically connected to patterns 7 provided on the substrate 6 by wire bonding or the like. In addition, as shown in FIG. 3, the other end portion protruding to the other side of the one end portion are SMD terminal portions 3b which are electrically connected to a printed circuit board (not shown) mounting the connector receptacle 20.

The shell (shielding member) 4 is formed of an electro-conductive material and as shown in FIG. 5, it is formed to be almost cylindrical from the contacts 2 so as to be able to surround and shield the region of the contact holding portion 1c of the housing. An opening portion of the almost cylindrical shell 4 is an inserting port 4a into which the connector plug X is to be inserted and mate with. In this shell 4, a shell terminal 4b is provided, which is electrically connected to the printed circuit board (not shown) mounting the connector receptacle 20.

As described above, the substrate 6 is bonded and fixed on the substrate bonded portion 1a of the housing 1 and on an opposite surface of the bonded surface, that is, on an upper surface, the physical layer basic circuit 5 to be described later is mounted. In addition, as shown in FIG. 4, the patterns 7 connected to the physical layer basic circuit 5 are provided on the upper surface of the substrate 6. As described above, the patterns 7 are electrically connected to the contacts 2 and the terminals 3 by wire bonding or the like. Terminating resistances 10 corresponding to characteristic impedance of a cable Y (referring to FIG. 7) provided with the connector plug X to be connected to the connector receptacle 20 are connected to the patterns 7. The lower surface of the substrate 6 is a ground surface and it is connected to the patterns 7 on the upper surface and to the terminals 3 by through holes 11 and via holes (not shown).

As shown in FIG. 5, the physical layer basic circuit 5 is mounted on the substrate 6 in a state of being molded and protected by a molding resin 9. In addition, in FIGS. 1 and 4, the molding resin 9 is not shown. The physical layer basic circuit 5 may be mounted onto the substrate 6 in a state of a bare chip.

The physical layer basic circuit 5 performs predetermined operations such as serial-parallel conversion, encoding and decoding operations, and connector input-output control so that a data signal is communicated in series with the connector plug X at each of the plurality of contacts 2, mores specifically, at each of contacts 2c for the digital signals and the data signal is communicated in parallel with the link layer circuit (not shown) which is an upper layer circuit for communication.

Figure 6:
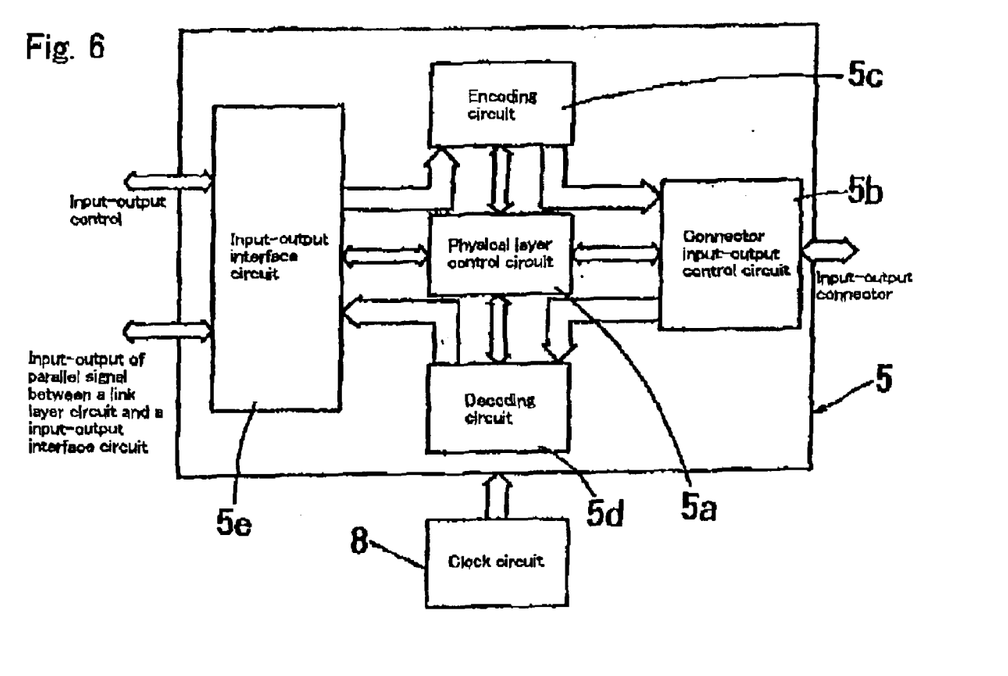
FIG. 6 is a functional block diagram showing a physical layer basic circuit provided in the connector receptacle.

As shown in FIG. 6, the physical layer basic circuit 5 comprises a physical layer control circuit 5a, a connector input-output control circuit 5b, an encoding circuit 5c, a decoding circuit 5d and an input-output interface circuit 5e and they are constructed to a large-scale integrated circuit together with a clock circuit 8. In addition, the clock circuit 8 may be designed as such that it is combined in the physical basic circuit 5 itself.

The physical layer control circuit 5a mainly responses a request of arbitration from the link layer circuit which is an upper layer for communication, resets a physical layer circuit consisting of the physical layer basic circuit 5 and the terminating resistance 10 to be described later, arbitrates the communication with an outer physical layer circuit (not shown) which is a lower layer circuit of the link layer circuit for communication and is different from the above-described physical layer circuit, and maintains and controls other circuits among the physical layer circuits.

The connector input-output control circuit 5b is connected to the above-described contacts 2c for the digital signal and mainly outputs and drives a signal transmitted from the encoding circuit 5c, to the connector plug X, selects an arbitration control signal and the data signal out of the signals input from the connector plug X and transmits the signal to the decoding circuit 5d.

The encoding circuit 5c turns the serial data signal input from the above-mentioned link layer circuit through the input-output interface circuit 5e into the data signal and a strobe signal, that is, performs encoding operation. The decoding circuit 5d regenerates the data signal according to the signal from the connector plug X in synchronized with a clock input from the clock circuit 8, that is, performs decoding operation. In addition, the clock may be input from the clock circuit 8 provided outside the connector receptacle 20 through the terminals 3 of the connector receptacle 20.

The input-output interface circuit 5e controls input-output with the above-described link layer circuit and in addition, converts the parallel data signal input from the above-described link layer circuit to the serial data signal, transmits the serial data signal to the encoding circuit 5c, converts the serial data signal from the decoding circuit 5d to the parallel data signal and outputs the parallel data signal to the link layer circuit.

Figure 7:
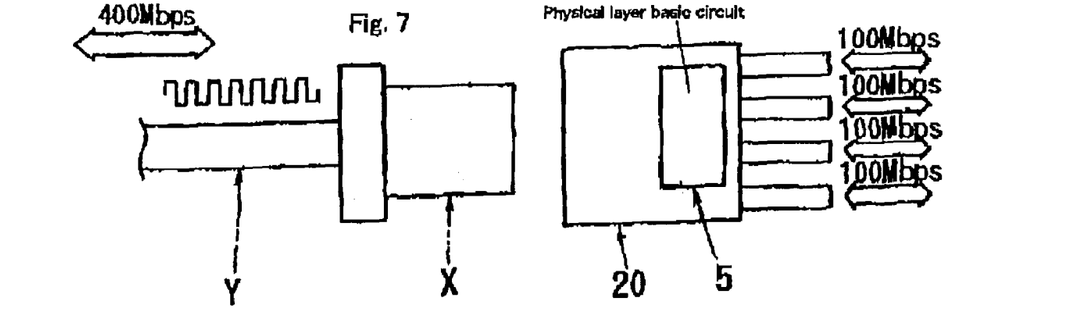
FIG. 7 is an explanatory drawing showing a transmission state of a data signal in the connector receptacle.
Figure 8:
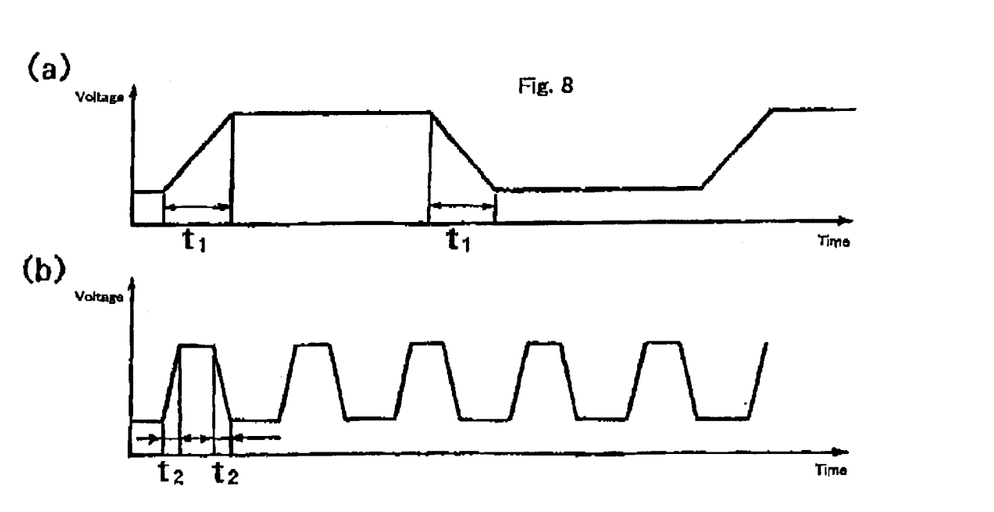
FIG. 8 is an explanatory drawing for comparing a transmission state of parallel communication with a transmission state of serial communication in the connector receptacle.
Figure 9:
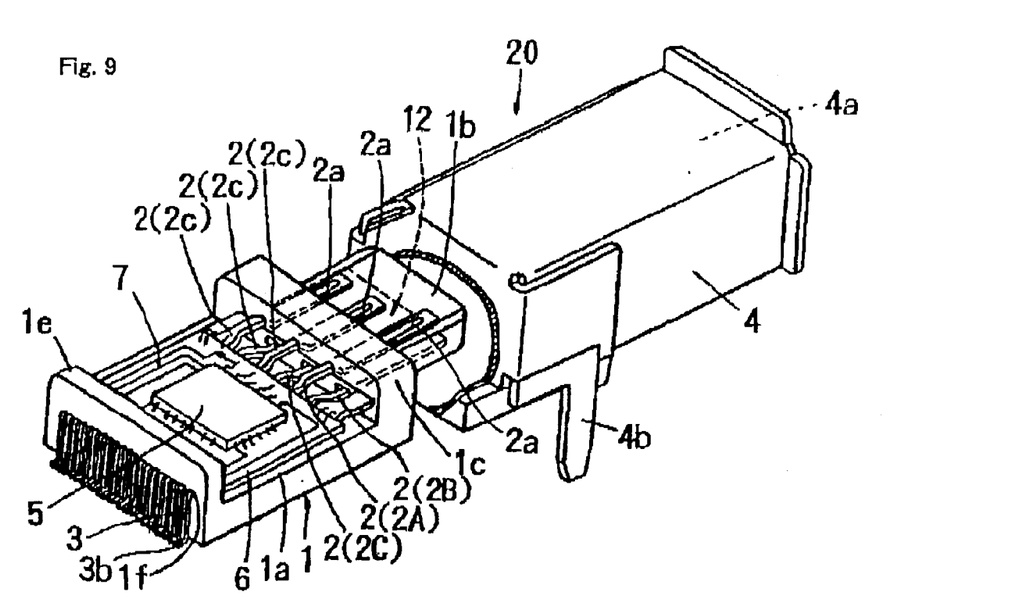
FIG. 9 is a perspective view showing a connector receptacle according to an embodiment 2 of the present invention.
Figure 10:
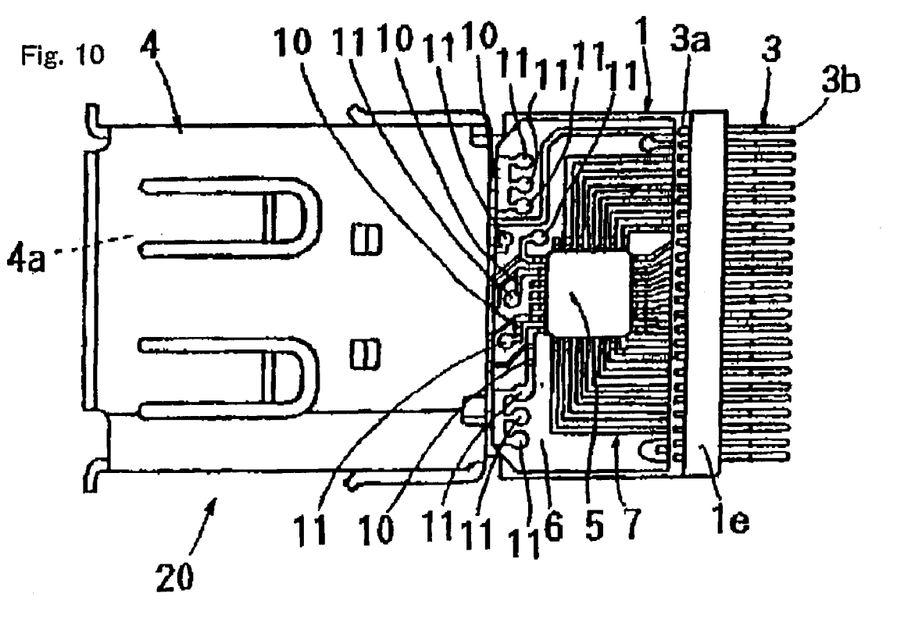
FIG. 10 is a plan view showing the connector receptacle shown in FIG. 9.

More specifically, as shown in FIG. 7, when for example, the parallel data signal is communicated in parallel at 4 bits of 100 Mbps, the serial data signal is communicated at 400 Mbps. That is, the parallel data signal is transmitted through transmission lines which are four times as many as that of the serial data signal. As shown in FIG. 8(a) and 8(b), a rise time and fall time $t_1$ of the parallel data signal is four times as long as a rise time and fall time $t_2$ of the serial data signal. In addition, the parallel data signal is not limited to be communicated in parallel at 4 bits of 100 Mbps.

According to the above connector receptacle 20, since the physical layer basic circuit 5 is provided in the connector receptacle 20 itself, a distance between the contacts 2 and the physical layer basic circuit 5 is reduced as compared with the conventional example in which the physical layer basic circuit 5 is mounted onto the printed circuit board. Consequently, it is not necessary to pay so much attention as in the conventional example in designing a pattern layout so as to prevent influence on the EMI and transmission characteristics, and it is easy to design the layout of the patterns constituting the transmission lines for the data signal.

In addition, when the data signal is communicated in parallel, it is transmitted through the transmission lines which are four times as many as compared with those of the communication in series. As a result, when the data signal is communicated in parallel, the rise time and fall time of the data signal is four times as long as that of the serial communication. Consequently, a high-frequency ingredient is alleviated and the EMI can be reduced.

Embodiment 2

Then, a connector receptacle according to an embodiment 2 of the present invention will be described in reference to FIGS. 9 to 13. In addition, in FIGS. 9 to 11, a molding resin 9 is not shown. Furthermore, portions substantially having the same functions as in the embodiment 1 are allotted to the same reference numerals and characters and only portions different from those in the embodiment 1 will be described.

The connector receptacle 20 according to this embodiment of the present invention is basically the same as in the embodiment 1 except that a data signal is communicated in series from contacts 2 to a physical layer basic circuit 5 through transmission lines having almost constant characteristic impedance, and the center of the upper and lower contacts 2 is positioned at almost the same plane as an upper surface of a substrate 6.

Figure 12:
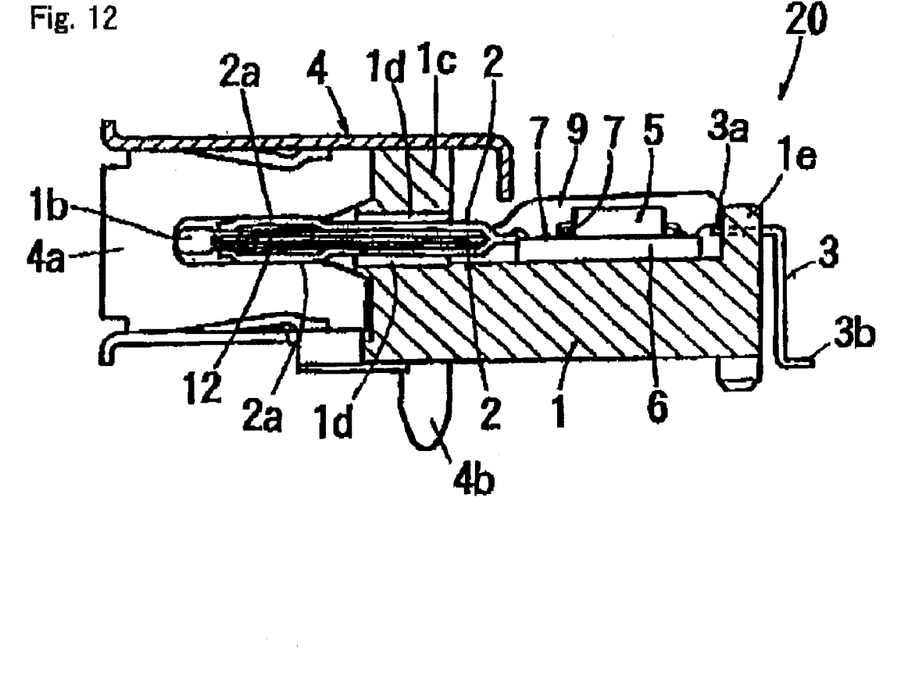
FIG. 12 is a side sectional view showing the connector receptacle shown in FIG. 9.

Specifically, as shown in FIG. 12, a contact supporting portion 1b is provided with a ground plane 12 at a central portion in its thickness direction so as to have a microstrip structure, in which the characteristic impedance of the contact 2 is kept almost constant so as to be matched with characteristic impedance of a cable Y provided with a connector plug X to be connected to the connector receptacle 20.

Figure 11:
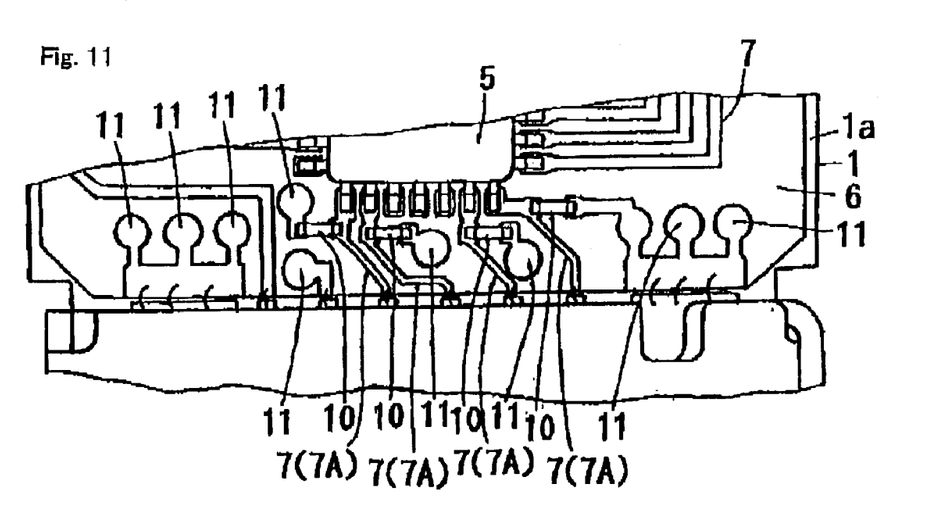
FIG. 11 is a partially enlarged plan view showing the connector receptacle shown in FIG. 9.
Figure 13:
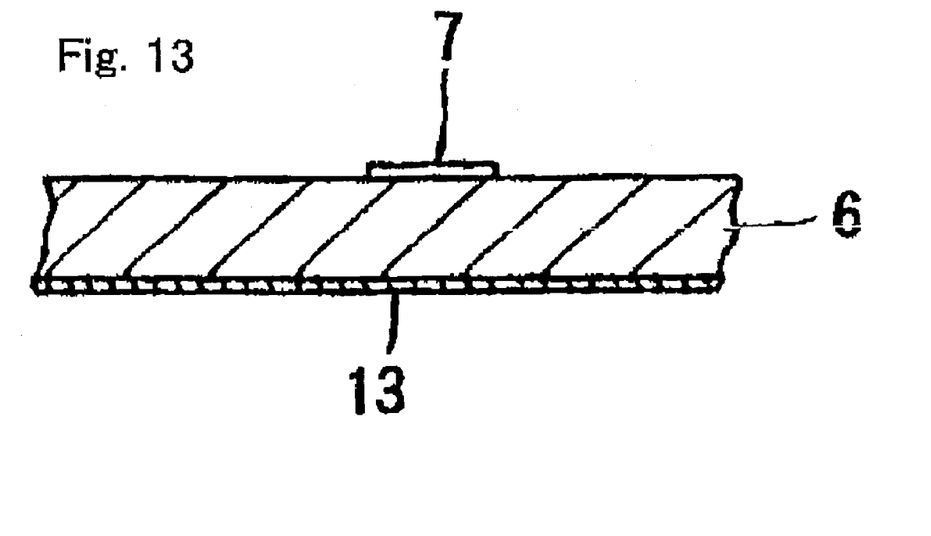
FIG. 13 is a partially sectional view showing a transmission line in the connector receptacle shown in FIG. 9.

As shown in FIG. 11, the patterns 7A of the patterns 7 provided on the upper surface of the substrate 6, which are disposed between connecting portions with the contacts by wire bonding and the terminating resistances 10, each have a constant width dimension. In addition, it is desirable that the patterns 7 between the terminating resistance 10 and the physical layer basic circuit 5 have the same width. As shown in FIG. 13, the substrate 6 is provided with a ground plane 13 on its lower surface and has the microstrip structure so as to correspond to the characteristic impedance of the contact 2.

Thus, the transmission lines from the contacts 2 to the physical layer basic circuit 5 have almost the constant characteristic impedance. In addition, the ground plane 13 of the substrate 6 is electrically connected to the ground plane 12 of the contacts 2 by wire bonding or the like. Furthermore, as these electrically connecting portions are increased, the EMI characteristic is improved.

According to the connector receptacle 20 of this embodiment, in addition to the effect in the embodiment 1 of the present invention, since the data signal is serially communicated through the patterns 7 serving as the transmission lines having almost the constant characteristic impedance from the contacts 2 to the physical layer basic circuit 5, the reflection of the data signal at the time of the input-output can be reduced.

In addition, since the contact 2 is positioned at almost the same plane as the substrate 6, there is no sharp bending portion which is not good for transmission characteristics and thus, the transmission characteristics can be improved.

Embodiment 3

Then, a connector receptacle according to an embodiment 3 of the present invention will be described in reference to FIGS. 14 to 17. In addition, in FIGS. 14 to 16, a molding resin 9 is not shown. Furthermore, portions substantially having the same functions as in the embodiment 2 are allotted to the same reference numerals and characters and only portions different from those in the embodiment 2 will be described.

Figure 14:
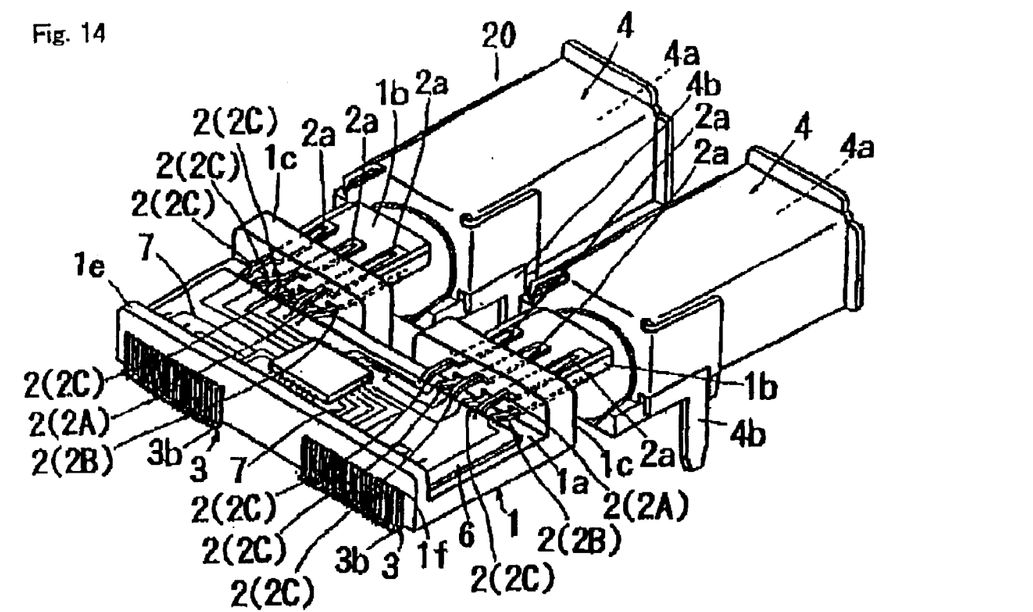
FIG. 14 is a perspective view showing a connector receptacle according to an embodiment 3 of the present invention.
Figure 15:
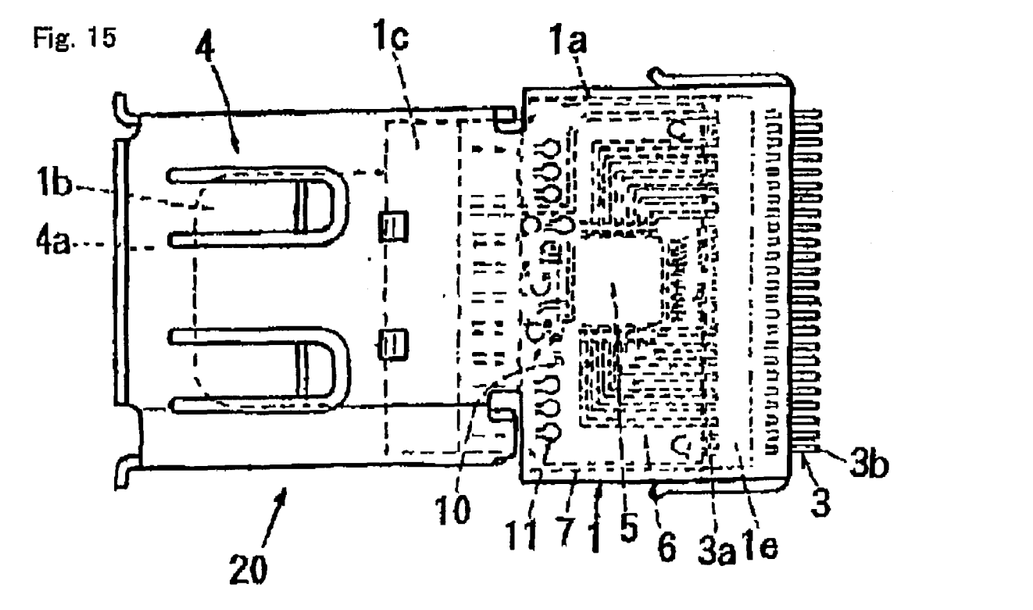
FIG. 15 is a plane view showing the connector receptacle shown in FIG. 14.

The connector receptacle 20 according to this embodiment of the present invention is basically the same as in the embodiment 2 except that a data signal is serially communicated with contacts 2 through patterns 7 serving as transmission lines having almost the same length between the contacts 2 and the physical layer basic circuit 5. In addition, as shown in FIG. 14, there are two contact supporting portions 1b and two shells 4, contacts 2 are provided both upper and lower portions of each of the two contact supporting portions 1b, and the shell 4 extends so as to shield the patterns 7 serving as transmission lines to which the data signal is transmitted from a connector plug X, from the outside.

Figure 16:
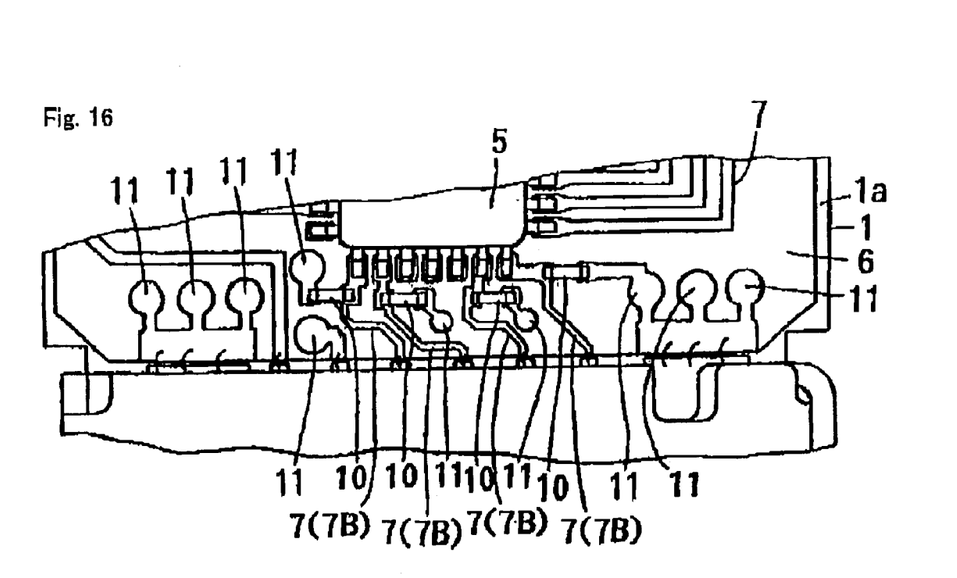
FIG. 16 is a partially enlarged plane view showing the connector receptacle shown in FIG. 14.
Figure 17:
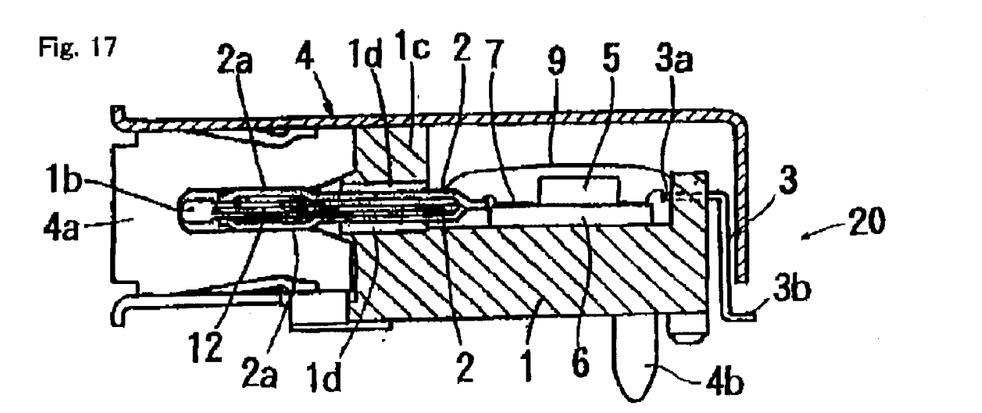
FIG. 17 is a side sectional view showing the connector receptacle shown in FIG. 14.

According to the connector receptacle 20, as shown in FIG. 16, the patterns 7 from the contacts 2 to the physical layer basic circuit 5, more specifically, the patterns 7B positioned between a connecting portion with the contacts 2 by wire bonding and terminating resistances 10 each are transmission lines having almost the same length at each of the plurality of contacts 2. In addition, it is desirable that the patterns 7 positioned between the terminating resistances 10 and the physical layer basic circuit 5 are transmission lines each having the same length at each of the contacts 2 when the data signal is communicated in series.

In this case, the physical layer basic circuit 5 performs predetermined operations such as serial-parallel conversion, encoding and decoding operations and connector input-output control so that the data signal is communicated in series with the connector plug X mate with each of the two contact supporting portions 1b and communicated in parallel with a link layer circuit for communication.

According to the connector receptacle 20 of this embodiment of the present invention, in addition to the effect in the embodiment 2, since the date signal is transmitted through transmission lines each having almost the same length between each of the contacts 2 and the physical layer basic circuit 5, a skew between the data signals can be reduced.

In addition, since there are two contact supporting portions 1b, as compared with the case where a plurality of connector receptacles 20 each provided with one contact supporting portion 1b are arranged, the connector receptacle 20 according to this embodiment of the present invention can be easily arranged.

Furthermore, although there are two contact supporting portions 1b, there can be only one physical layer basic circuit 5 which performs predetermined operations such as the serial-parallel conversion, the encoding and decoding operations and the connector input-output control so that the data signal can be communicated in series with the connector plugs X mate with the two contact supporting portions 1b respectively. Consequently, as compared with the case where two physical layer basic circuits 5 are arranged, the whole size can be reduced.

In addition, since the patterns 7 serving as the transmission lines to which the data signal is transmitted from the connector plug X can be shielded from the outside by the shell 4, the EMI can be reduced.

Embodiment 4

Figure 19:
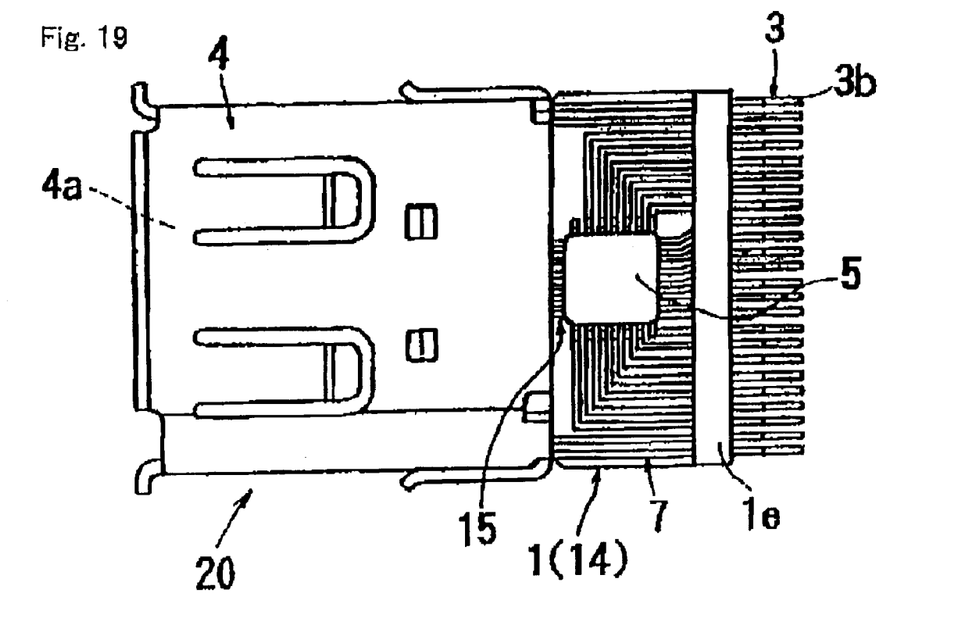
FIG. 19 is a plane view showing the connector receptacle shown in FIG. 18.
Figure 20:
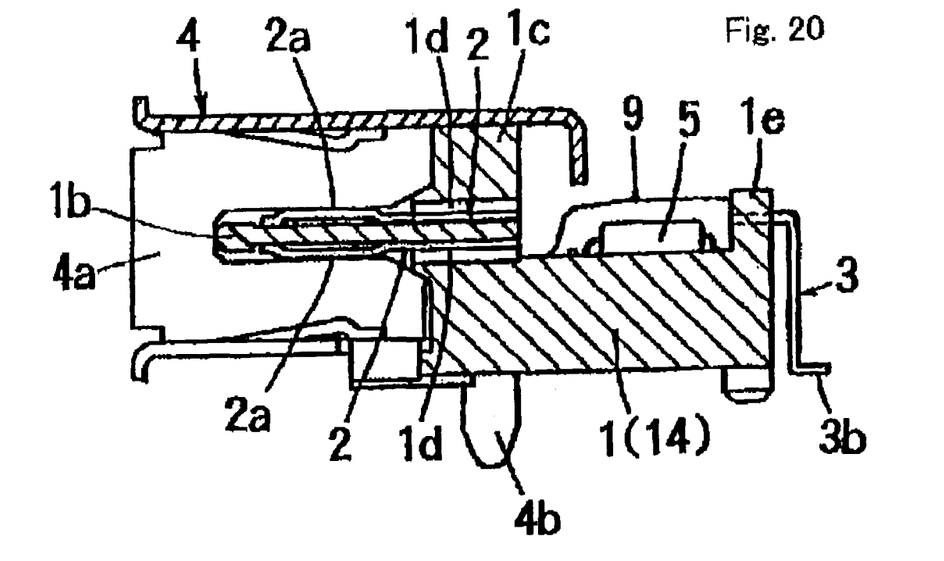
FIG. 20 is a side sectional view showing the connector receptacle shown in FIG. 18.

Then, a connector receptacle according to an embodiment 4 of the present invention will be described in reference to FIGS. 18 to 20. In addition, portions substantially having the same functions as in the embodiment 1 are allotted to the same reference numerals and characters and only portions different from those of the embodiment 1 will be described.

While the physical layer basic circuit 5 is provided on the substrate 6 bonded to the substrate bonded portion 1a of the housing 1 according to the above embodiment 1 of the present invention, according to this embodiment of the present invention, a physical layer basic circuit 5 is provided on an MID (Molded Interconnection Device) substrate 14 constituting a housing 1.

Figure 18:
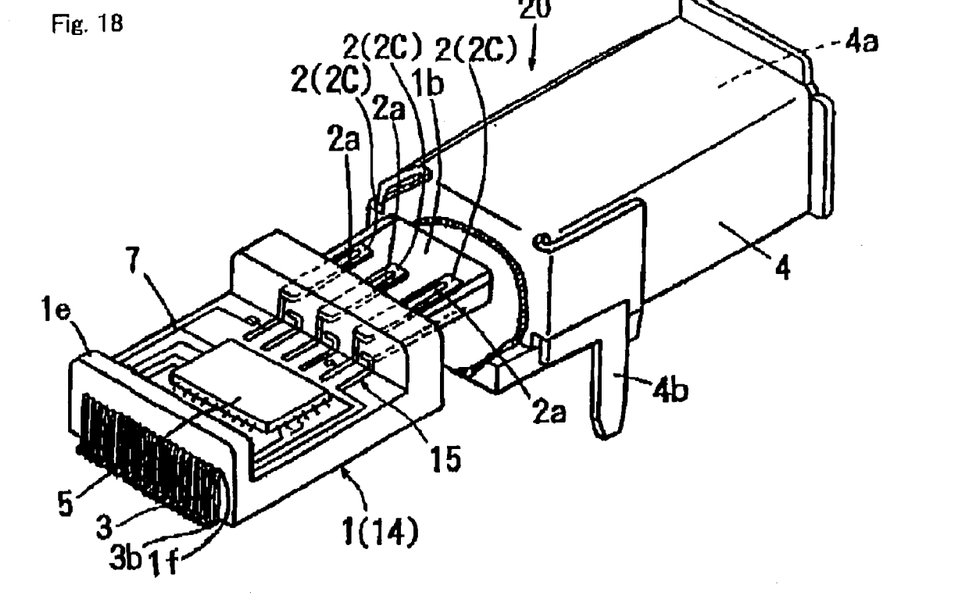
FIG. 18 is a perspective view showing a connector receptacle according to an embodiment 4 of the present invention.

More specifically, as shown in FIG. 18, conductive plating patterns 15 are provided on the MID substrate 14 and the physical layer basic circuit 5 is mounted onto the conductive plating patterns 15. As shown in FIG. 20, similar to the embodiment 1 of the present invention, the housing 1 comprising the MID substrate 14 is provided with a contact holding portion 1c having contact press-fitting holes 1d which press in and hold the contacts 2.

According to the connector receptacle 20 of this embodiment of the present invention, in addition to the effect in the embodiment 1, since the contacts 2 are held by the MID substrate 14 on which the physical layer basic circuit 5 is mounted, it is not necessary to additionally provide a member for holding the contacts 2 other than the member on which the physical layer basic circuit 5 is mounted, that is, the MID substrate 14, so that the number of parts can be reduced.

Thus, although the preferred embodiments of the present invention were described, the present invention is not limited to theses embodiments and various changes can be made within the spirit and scope of the present invention.

For example, according to the above-described embodiments 1 to 4, although there are six contacts 2 comprising the contact 2B for a power supply and the contact 2A for ground, the same effect can be obtained even when there are four contacts without the contact 2B for power supply and the contact 2A for ground.

INDUSTRIAL APPLICABILITY

As described above, according to the connector receptacle of the present invention, the physical layer basic circuit performing operations such as serial-parallel conversion in communicating the data signal is provided in the connector receptacle itself. Therefore, the design for a layout of patterns forming the transmission lines for the data signal can be easily made. Thus, it can be optimally used in a connector apparatus or the like which is used particularly for transmitting a digital signal at high speed.

What is claimed is:

1. A connector receptacle comprising:
   a housing having at least one mating portion configured to mate with a connector plug; and
   a plurality of contacts positioned to be electrically connected to the connector plug when the connector plug is mated with the mating portion; and
   a physical layer basic circuit provided on the housing and configured to perform predetermined operations such that a data signal is communicated in series with the contacts through the connector plug and in parallel with a link layer circuit for communication.

2. A connector receptacle according to claim 1, further comprising a plurality of transmission lines each having substantially constant characteristic impedance and configured to communicate said data signal in series from said contacts to said physical layer basic circuit.

3. A connector receptacle according to claim 1, further comprising a plurality of transmission lines each having substantially same length and configured to transmit said data signal between each of said plurality of contacts and said physical layer basic circuit.

4. A connector receptacle according to claim 1, wherein said physical layer basic circuit is provided on a substrate and said contacts are positioned on a substantially same plane as the substrate.

5. A connector receptacle according to claim 1, wherein said at least one mating portion comprises a plurality of mating portions.

6. A connector receptacle according to claim 5, wherein said physical layer basic circuit performs said predetermined operations so that a data signal is communicated in series with said connector plugs mate with said plurality of mating portions and communicated in parallel with said link layer circuit.

7. A connector receptacle according to claim 1, further comprising a plurality of transmission lines through which the data signal is transmitted from said connector plug and a shielding member shielding the plurality of transmission lines from the outside.

8. A connector receptacle according to claim 1, wherein said physical layer basic circuit is provided on an MID substrate and said contacts are held by the MID substrate.

9. A connector receptacle according to claim 1, further comprising a plurality of transmission lines formed on the housing, wherein said data signal is transmitted in parallel through the plurality of transmission lines which are N times as many compared with the plurality of transmission lines for communication in series, and a rise time and fall time when said data signal is communicated in parallel is N times as long compared with the rise time and fall time when said data signal is communicated in series.

10. A connector receptacle according to claim 1, wherein said physical layer basic circuit comprises a connector input-output control circuit, a physical layer control circuit, an encoding circuit, a decoding circuit, and an input-output interface circuit.

* * * * *